United States Patent [19]
Takikawa et al.

[11] Patent Number: 4,574,292
[45] Date of Patent: Mar. 4, 1986

[54] THERMAL HEAD

[75] Inventors: Osamu Takikawa, Kamakura; Mitsuo Harata, Kawasaki, both of Japan

[73] Assignee: Kabushiki Kaisha Toshiba, Kawasaki, Japan

[21] Appl. No.: 675,212

[22] Filed: Nov. 27, 1984

[30] Foreign Application Priority Data

Jan. 27, 1984 [JP] Japan .................................. 59-11851
Jun. 26, 1984 [JP] Japan ................................ 59-130110

[51] Int. Cl.⁴ ......................... E01D 15/10; H05B 1/00
[52] U.S. Cl. ............................... 346/76 PH; 219/216; 219/543
[58] Field of Search ................... 346/76 PH; 219/216, 219/543

[56] References Cited

U.S. PATENT DOCUMENTS 4,101,708  7/1978  Larry .................................. 428/432
4,203,025  5/1980  Nakatani et al. .................... 219/216
4,296,309  10/1981 Shinmi et al. ...................... 219/216

FOREIGN PATENT DOCUMENTS 2397941  2/1979  France ............................... 400/126
59-8232   2/1984  Japan ................................. 400/120
2001009   1/1979  United Kingdom ............... 219/216

Primary Examiner—Joseph W. Hartary
Assistant Examiner—Gerald E. Preston
Attorney, Agent, or Firm—Oblon, Fisher, Spivak, McClelland & Maier

[57] ABSTRACT

In a thermal head having a substrate and a heating resistor of thin film type formed thereon, the heating resistor is a deposited metal oxide film essentially consisting of ruthenium oxide and an oxide of at least one metal M selected from the group consisting of Ca, Sr, Ba, Pb, Bi and Tl. The deposited metal oxide film has an atomic ratio M/Ru of the metal M to ruthenium of 0.6 to 2.

8 Claims, 5 Drawing Figures

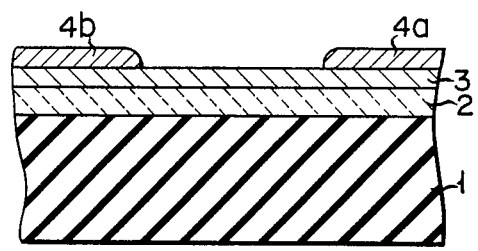
F I G. 1
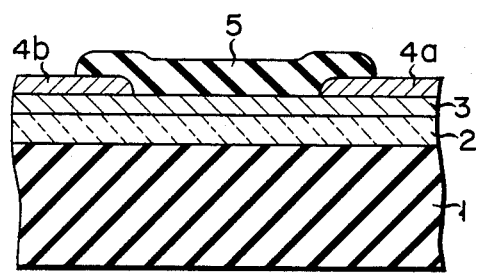
F I G. 2
F I G. 3A
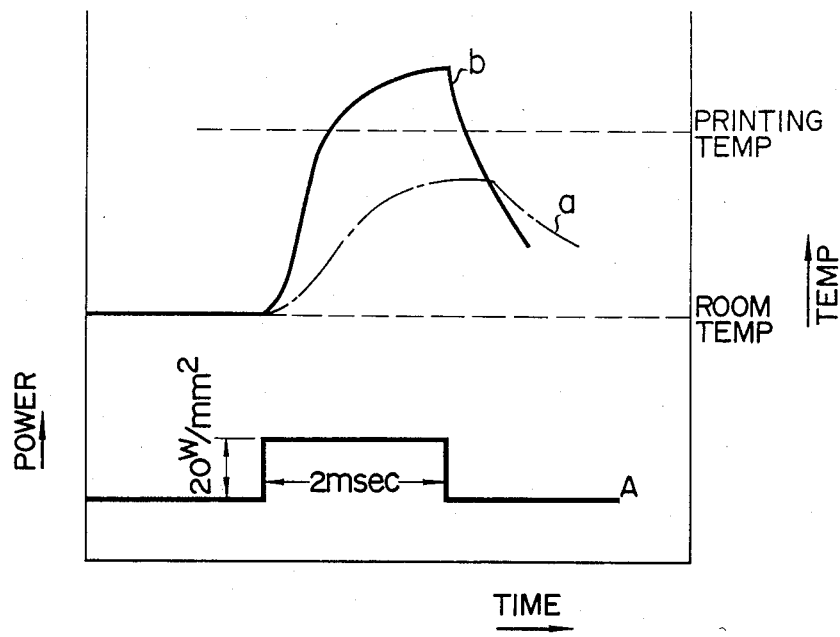

THERMAL HEAD

BACKGROUND OF THE INVENTION

1. Field of the Invention

The present invention relates to a thermal head used in thermal character recording.

2. Description of the Prior Art

A thermal head consists of, for example, a glazed ceramic substrate and a plurality of heating resistors formed thereon. Conductors for supplying electric power to the heating resistors are also disposed on the glazed ceramic substrate. Recording information with this thermal head is performed in the following manner. A current is supplied through the conductors to the predetermined heating resistors which are necessary for obtaining a heat pattern corresponding to information to be recorded, thereby heating the heating resistors. Then, the heating resistors are brought into contact with a recording medium, thereby recording the information.

A heating resistor of thick film type is known as such a heating resistor, as reported in Japanese Patent Disclosure No. 54-44798. In order to obtain the heating resistor of this type, a resin and a solvent are added to a mixture of $RuO_2$ and glass making a paste which is coated and baked on a substrate. However, this heating resistor has large variations of resistance due to the particle size of the raw material, scatter temperature and time. In addition, since the heating resistor of this type is manufactured by screen printing which cannot substantially perform micropatterning, the resolution becomes undesirably low.

On the other hand, a heating resistor of the thin film type formed of tantalum nitride, nichrome, Cr-Si series cermet and the like is known. However, when the heating resistor formed of such a material is heated to a high temperature, considerable oxidation occurs, thereby increasing its resistance. Generally, in order to prevent such a disadvantage, an oxidation resistance film formed of $SiO_2$ is provided on the surface of the heating resistor. However, oxidation cannot be sufficiently prevented and the manufacturing procedures become overly complex if this oxidation resistance film is formed. In particular, since the $SiO_2$ film has a low thermal conductivity, it takes considerable time to transmit heat energy from the heating resistor to thermal paper through this $SiO_2$ film. Therefore, it is difficult to realize the type of high-speed printing that has been demanded recently. On the other hand, the difference between the thermal expansion coefficients of the substrate and the heating resistor causes cracking in the heating resistor in time, resulting in a malfunction of the thermal head. Furthermore, in order to prevent degradation due to oxidation, the heating resistor must be maintained at a low temperature, and so the high-speed printing demanded recently cannot be realized.

A heating element formed of $SnO_2$ in which an impurity is doped is known. However, this material is known as an oxide semiconductor, and has the characteristic that the resistance value is decreased in accordance with an increase in temperature. If the heating resistor having such a characteristic is used, the initial value of the electric power must be decreased because of the low voltage-current capacity of the semiconductor to which electric power is supplied and controlled, resulting in a low printing speed.

The present invention has been made in consideration of the above situation, and has as its object to provide a thermal head which can realize high-speed printing and can be stable over time.

SUMMARY OF THE INVENTION

A thermal head according to the present invention comprises a substrate and a heating resistor of thin film type formed thereon. The heating resistor is formed of ruthenium oxide and an oxide of at least one metal M selected from the group consisting of Ca, Sr, Ba, Pb, Bi and Tl. The atomic ratio M/Ru of this metal oxide film containing Ru and the metal M falls within the range between 0.6 and 2.

In such a thermal head, a conductor which is coupled to the heating resistor and supplies electric power thereto is provided on the substrate. This conductor must be formed of a metal which can minimize the change in resistance of the heating resistor. Ni, Ti, and a multilayer structure such as Ni-Au, Ti-Au, and Ti-Ni-Au are known as such a metal. In this case, Pd can be used instead of Ni. In the multilayer structure, since Au has poor adhesion to the material which forms the heating resistor, an Au layer is formed as an uppermost layer. Note that a Ti, Cr, W, or Al layer can be formed on the uppermost layer. The multilayer structure is occasionally alloyed at the layer boundaries or throughout the structure through heat treatment after forming the conductor.

The reason why the heating resistor in the thermal head according to the present invention is formed of the above material is as follows. If the heating resistor is formed of only $RuO_2$, the humidity resistance thereof is degraded. However, when an oxide of at least one metal M selected from the group consisting of Ca, Sr, Ba, Pb, Bi and Tl is added to $RuO_2$, the humidity resistance can be improved. Ba oxide is preferably added to $RuO_2$ as an oxide of the metal M.

The atomic ratio M/Ru of Ru and the metal M in the metal oxide film containing Ru and metal M preferably falls within the range between 0.9 and 1.2. When M/Ru = 1 is established, the metal oxide film containing Ru and the metal M provides a very stable structure of $RuCaO_3$, $RuSrO_3$, $RuBaO_3$, $RuPbO_3$, $RuBiO_{7/2}$, or $RuTlO_{7/2}$. If the ratio M/Ru is less than 0.6, the humidity resistance is degraded due to the influence of precipitated $RuO_2$. If the ratio M/Ru exceeds 2, the resistance becomes undesirably high, and the resistance temperature coefficient becomes negative. Note that if the ratio M/Ru is more than 4, the metal oxide film nearly becomes an insulating material.

A thin metal oxide film constituting the heating resistor is formed by a known method such as a sputtering method using a predetermined metal oxide as a target, a reactive sputtering method which uses predetermined metals as targets and is performed in an atmosphere including an oxidizing gas, and an evaporation method. A desired resistance value can be obtained by properly changing the thickness of the metal oxide film. However, if the thickness of the metal oxide film is too small, the resistance value is largely changed with a slight change in thickness thereof. Therefore, it is difficult to obtain a desired resistance value. For this reason, the thickness of the metal oxide film is preferably set to be 10 nm or more in practice. On the other hand, when the thickness of the film is too great, a considerable time period is required for forming it. In addition, in this case, the resistance value becomes too low. Therefore, the thickness of the film is set to be 1 μm or less, and preferably 300 nm or less.

As described above, in the thermal head according to the present invention, since the heating resistor is formed of a material having a good oxidation-resistance property, a change in resistance of the heating resistor due to oxidation need not be considered. For this reason, a large amount of electric power can be applied to the heating resistor to heat it to a high temperature, and it can operate stably over a long period of time. Since the thin metal film consisting of the heating resistor has a high sheet resistance, only a relatively small current is required to obtain a high heat release density. In other words, the thin metal film can be heated to a desired temperature by a low current in a short time. For this reason, since the current flowing through the conductor coupled to the heating resistor becomes low and since heat generated by the conductor can be reduced, a so-called printing fog can be prevented. Since the heating resistor of the present invention has a positive resistance temperature coefficient, defects of a conventional heating resistor formed of a $SnO_2$ material can be eliminated. Therefore, the initial value of electric power can become large, thereby realizing high-speed printing.

In the thermal head of the present invention, a protective layer formed of $Al_2O_3$ is preferably formed on the surface of the heating resistor for the following reason. Since the heating resistor is brought into contact with thermal paper, a wearing resistance is required in addition to an oxidation resistance. In a conventional heating resistor, since an $SiO_2$ film used as an oxidation resistance film has the insufficient wearing resistance, a $Ta_2O_5$ film is further formed thereon. However, the $Ta_2O_5$ film must have a thickness of about 5 μm in order to obtain a sufficient wearing resistance. If the heating resistor coated with such a thick $Ta_2O_5$ film is used, a large amount of electric power is needed in order to obtain a desired surface temperature, resulting in a powerful electric source. In other words, demand for, for example, a compact facsimile system cannot be satisfied. Since the heating resistor of the present invention can prevent degradation due to oxidation as described above, an $SiO_2$ film need not be formed. However, in view of the wear due to contact with the thermal paper, a wearing protective layer is preferably formed. In this case, since the wearing protective film also requires oxidation resistance, an oxide film is used. However, the heating resistor itself is formed of an oxide. In addition, the oxide constituting the protective layer is diffused or reacts in or with the heating resistor during the operation at high temperatures, thereby changing the resistance of the heating resistor. For this reason, it is important to properly select the material of the protective layer. The present inventors examined various materials and confirmed that an $Al_2O_3$ film caused only small changes in the resistance of the heating resistor during operation at high temperatures.

The $Al_2O_3$ film has a thermal conductivity more than ten times that of a conventional oxidation resistance film of $SiO_2$. Therefore, heat generated by the heating resistor is transmitted to a surface of the $Al_2O_3$ film, thereby realizing high-speed printing by the thermal head. In addition, the $Al_2O_3$ film has a greater hardness than that of the $Ta_2O_5$ film, and can be formed to be thin. The thickness of the $Al_2O_3$ film can be properly selected according to various conditions adopted. However, if the $Al_2O_3$ film is too thin, the wearing resistance becomes too low. If the $Al_2O_3$ film is too thick, high-speed printing cannot be achieved. Therefore, the thickness of the $Al_2O_3$ film is preferably set to fall within the range between 1 μm and 4 μm. The $Al_2O_3$ film is formed by a known sputtering method or a deposition method, such as RF sputtering, E-Gan deposition, ion-plating, or reactive sputtering using Al as a target.

BRIEF DESCRIPTION OF THE DRAWINGS

FIG. 1 is a sectional view of a thermal head according to an embodiment of the present invention;

FIG. 2 is a sectional view of a thermal head according to another embodiment of the present invention;

FIGS. 3A and 3B are respectively graphs showing the relationship between a time of pulse power application and a surface temperature of a protective layer in the thermal head shown in FIG. 2.

DETAILED DESCRIPTION OF THE PREFERRED EMBODIMENTS

Figure 3B:
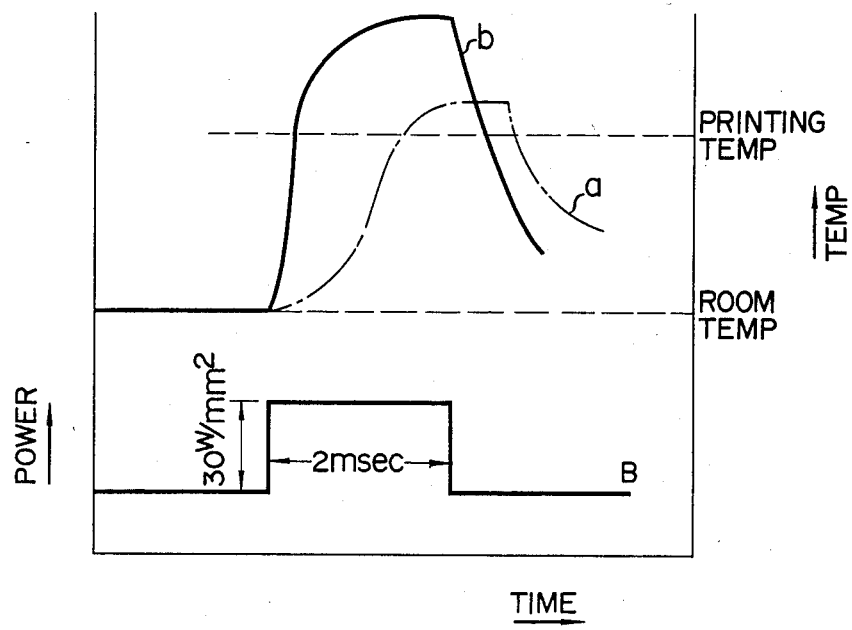

The present invention will be described by way of examples with reference to the accompanying drawings hereinafter.

EXAMPLE 1

FIG. 1 shows a sectional view of a main portion of a thermal head having no protective layer. In FIG. 1, a glass-glazed layer 2 is formed on a ceramic substrate 1 formed of, for example, $Al_2O_3$ so as to flatten a surface thereof. A heating resistor 3 having a predetermined pattern is formed on the layer 2. Conductors 4a and 4b which supply electric power to the heating resistor 3 and are formed of, for example, a Ti-Au multilayer are coupled to the heating resistor 3.

First, a composition (Ba/Ru) of a target was changed when a film consisting essentially of Ba oxide and Ru oxide was formed by radio frequency (RF) sputtering using BaO and $RuO_2$ as the target. A resistivity and a resistance temperature coefficient of the oxide film were examined. The obtained result is shown in Table 1. Sputtering conditions were as follows:

atmosphere: Ar gas containing 50% of $O_2$
pressure: 10 m Torr
power density: 2 watt/$cm^2$ (target area)
substrate temperature: 300° C.

The heating resistor having a positive resistance temperature coefficient is preferable. Therefore, as is apparent from Table 1, the atomic ratio of Ba/Ru of the target must be 2 or less. When the atomic ratio of Ba/Ru is less than 0.6, the humidity resistance of the heating resistor is undesirably reduced. Therefore, the atomic ratio of Ba/Ru of the target, i.e., that of Ba/Ru in the metal oxide which constitutes the heating resistor, must fall within the range between 0.6 and 2. When Ca, Sr. Pb, Tl or Ba was used instead of Ba, substantially the same result was obtained.

TABLE 1

| Target composition (atomic ratio Ba/Ru) | Resistivity (Ω · cm) | Resistance-temperature coefficient |
|---|---|---|
| 0.5 | $8.3 \times 10^{-4}$ | plus |
| 0.6 | $9.0 \times 10^{-4}$ | plus |
| 1 | $3.0 \times 10^{-3}$ | plus |
| 2 | $1 \times 10^{-2}$ | plus |
| 3 | 2 | minus |

TABLE 1-continued

| Target composition (atomic ratio Ba/Ru) | Resistivity ($\Omega \cdot cm$) | Resistance-temperature coefficient |
|---|---|---|
| 4 | $10^3$ or more | minus |

Next, RF sputtering was performed under the same conditions as described above except that oxides of Ru and the metal M selected from the group consisting of Ca, Sr, Ba, Pb, Tl, and Bi (the atomic ratio M/Ru=1) were used as the target. As a result, various heating resistors (Examples 1 to 6) respectively having the compositions shown in Table 2 were obtained. The size of the heating resistor was 100 $\mu$m × 100 $\mu$m, and the thickness thereof was 50 nm.

For the purpose of comparison, the heating resistor of a thickness of 300 Å formed of $Ta_2N$ was formed by sputtering, and an $SiO_2$ film of a thickness of 3 $\mu$m was formed thereon as an oxidation resistance film, thereby obtaining a control sample.

A so-called step stress test was performed for samples which were prepared as described above, and the dielectric strength of the resistor was examined using a repetitive voltage having a pulse width of 5 msec, a frequency of 100 cycle/sec, and a supplying power increased by 1 watt/mm$^2$ every 30 minutes. As a result of such a test in the control sample, the changing rate of resistance exceeded 10% at the power density of 20 watt/mm$^2$. On the contrary, in the samples of Example 1 to 6, the changing rate of the resistance was 2% or less even when the power density exceeded 70 watt/mm$^2$. The changing rate of the resistance can be expressed by the following relation:

Changing rate of resistance =
[(resistance after pulse power application) −
(resistance before pulse power application)]/
(resistance before pulse power application) × 100

In this manner, in the heating resistor of the present invention, even when a considerably high voltage is applied thereto, the resistance change is small. This means that a high amount of electric power can be applied to the heating resistor, and therefore high-speed printing can be realized.

Next, durability of the respective samples was examined. Pulse power having a pulse width of 2 msec and a power density of 50 watt/mm$^2$ was applied on the respective sample resistors for a period of 10 msec, and the changing rate of resistance was measured. The obtained result is shown in Table 2.

TABLE 2

|   |   | Composition | Initial resistance (k$\Omega$) | Resistance change rate (%) Applied pulse (No.) | | | | | |
|---|---|---|---|---|---|---|---|---|---|
|   |   |   |   | $10^3$ | $10^4$ | $10^5$ | $10^6$ | $10^7$ | $10^8$ |
| Example | 1 | $RuCaO_3$ | 0.5 | 0 | 0 | 0 | +0.5 | +1.5 | 3 |
| Sample | 2 | $RuSrO_3$ | 0.6 | 0 | 0 | −0.1 | 0 | 1 | 4 |
| No. | 3 | $RuBaO_3$ | 1.0 | 0 | 0 | −0.1 | +0.2 | +1.5 | 3 |
|   | 4 | $RuPbO_3$ | 0.7 | 0 | 0 | −0.3 | 0.1 | 2 | 3.1 |
|   | 5 | $RuTlO_{7/2}$ | 0.6 | 0 | 0 | 0.1 | 0.6 | 1.5 | 2.3 |
|   | 6 | $RuBiO_{7/2}$ | 0.7 | 0 | 0 | 0 | 0.4 | 1 | 2 |
| Comparative Example 1 |   | $Ta_2N$ | 0.8 | 0 | 0.5 | 10 | 30 | 80 | 100 or more |

Changing rate of resistance =
{(resistance after pulse power application) −
(initial resistance)}/(initial resistance) × 100

As is apparent from Table 2, the heating resistor according to the present invention has a small changing rate of resistance and can ensure the long life of the thermal head.

EXAMPLE 2

FIG. 2 shows a sectional view of a main part of a thermal head having a protective layer. This thermal head comprises the same structure as that shown in FIG. 1 except for that it has a protective layer 5 formed of $Al_2O_3$ and multilayer structures (Ti: 50 nm, Ni: 50 nm and Au: 500 nm) formed of Ti-Ni-Au are used as conductors 4a and 4b.

A heating resistor 3 was formed of $BaRuO_3$ and was formed by RF sputtering using $BaRuO_3$ as a target in Ar gas containing 50% of $O_2$ gas at a substrate temperature of 300° C. and a pressure of 10 m Torr. The partial pressure of $O_2$ gas is preferably 0.5 to 100 m Torr. The thickness of this film was 50 nm. The protective layer 5 was formed by high frequency sputtering using $Al_2O_3$ as a target in an atmosphere of Ar gas at a substrate temperature of 200° C. and a pressure of 5 m Torr. The thickness of this layer was 2 $\mu$m. Note that the size of the heating resistor was 100 $\mu$m × 100 $\mu$m. In order to remove strain formed in the films due to sputtering and to stabilize the resistance of the thermal head, the thermal head was annealed at a temperature of 700° C. The annealing temperature can be properly set to any value according to actual use conditions. It may be usually 300° to 700° C.

For the purpose of the comparison, a thermal head was manufactured as a control sample comprising a heating resistor of $Ta_2N$ having a thickness of 30 nm, an oxidation resistance layer of $SiO_2$ having a thickness of 3 $\mu$m, and a wearing protective layer of $Ta_2O_5$ having a thickness of 5 $\mu$m. Note that the heating resistor of this thermal head had the same size as that of the above example.

The surface temperature of these two samples was measured at the same application power. FIGS. 3A and 3B show this result. In addition to this, FIGS. 3A and 3B show respective pulse waves (curves A and B) of application power. The resistance value of the example was 900 $\Omega$, and was different from that of the Control sample of 100 $\Omega$. Therefore, in FIGS. 3A and 3B, the respective pulse waves were expressed by electric power. FIG. 3A shows the surface temperature of the two thermal heads when electric power having a power density of 20 watt/mm$^2$ was applied for 2 msec. In FIG.

3A, curve a shows the change in the surface temperature of the control sample, the curve b shows that of the example, respectively. From FIG. 3A, the control sample cannot reach the temperature required for printing (i.e., the printing temperature in this embodiment is 250° C.) at the power density of 20 watt/mm$^2$. In addition to this, the control reaches a peak temperature only after the trailing edge of applied electric power. On the other hand, in the example, the rate of increase in the surface temperature is faster than that in the control sample, and the peak temperature reaches the desired printing temperature.

FIG. 3B shows surface temperatures of the two thermal heads when power having the power density of 30 watt/mm$^2$ was applied for 2 msec. From FIG. 3B, although the respective peak temperatures of the control (curve a) and the example (curve b) reach the printing temperature, the example can reach the peak temperature in a shorter time period than the control.

The durability test was performed in the same manner as in Example 1. The example had a low changing rate of resistance (i.e., +2% in this case) after the application of 10$^8$ pulse power. It was confirmed that the example had considerably good durability in comparison to the control having a changing rate of 100% or more. The heating resistors of various materials were subjected to the durability test. This result is shown in Table 3. In Table 3, the above-mentioned example and control are referred to as Example sample No. 9 and Control 2, respectively.

TABLE 3

| | | Composition | Initial resistance (kΩ) | Resistance change rate (%) Applied pulse (No.) | | | | | |
|---|---|---|---|---|---|---|---|---|---|
| | | | | 10$^3$ | 10$^4$ | 10$^5$ | 10$^6$ | 10$^7$ | 10$^8$ |
| Example Sample No. | 7 | RuCaO$_3$ | 0.7 | 0 | 0 | 0 | +0.1 | +0.4 | +1.2 |
| | 8 | RuSrO$_3$ | 0.8 | 0 | 0 | −0.1 | 0 | +0.5 | +1.5 |
| | 9 | RuBaO$_3$ | 1.2 | 0 | 0 | −0.1 | +0.3 | +1.1 | +2 |
| | 10 | RuPbO$_3$ | 0.7 | 0 | 0 | −0.2 | +0.6 | +0.9 | +2.3 |
| | 11 | RuTlO$_{7/2}$ | 0.7 | 0 | 0 | +0.1 | +0.5 | +1.2 | +2.4 |
| | 12 | RuBiO$_{7/2}$ | 0.8 | 0 | 0 | 0 | +0.1 | +1.3 | +2.7 |
| Control 2 | | Ta$_2$N | 0.9 | 0 | 0.5 | +9 | +27 | 70 | 100 or more |

As is apparent from Table 3, the heating resistors of the present invention can constitute long-life thermal heads, respectively.

Figure 4:
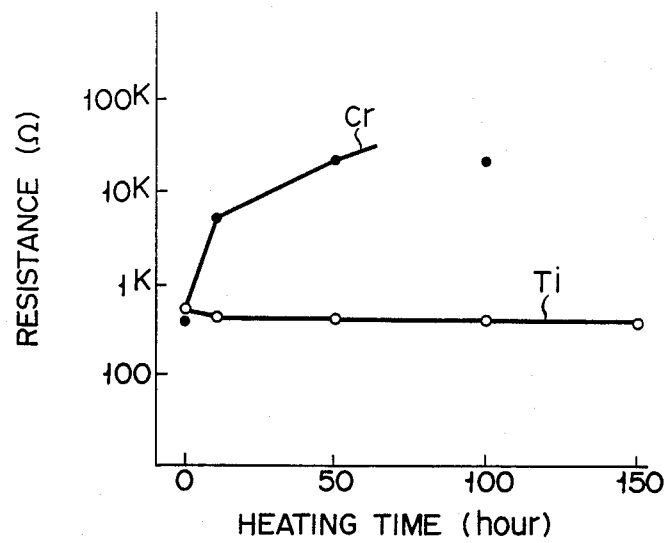
FIG. 4 is a graph showing the relationship between a heating time and a resistance value of a heating resistor when a Ti-Ni-Au multilayer and a Cr-Ni-Au multilayer are respectively used as electrodes in the thermal head shown in FIG. 2.

Since a thermal head is used at high temperatures, the characteristics thereof largely depend upon conductor materials. In this embodiment, the conductor formed of a Ti-Ni-Au multilayer (Ti is deposited at the side of the heating resistor) is used. For example, if Cr is used instead of Ti, the resistance value of the heating resistor is considerably changed. FIG. 4 shows the relationship between the respective heating times and the resistances in the case wherein a Cr-Ni-Au multilayer (Cr of 10 nm thickness is used instead of Ti) is used as the conductor and in the case wherein a Ti-Ni-Au multilayer is used as the conductor, respectively. The conductors were heated in an atmosphere to 600° C. as an acceleration test for the thermal heads. As is apparent from FIG. 4, when Ti was used no change was found after 150 hours. On the contrary, when Cr was used, a change occurred immediately after heating.

Such a Ti conductor can be formed by a known thin film forming method such as the deposition method. Only Ti film can be used. However, in order to reduce the resistance and to improve the wire bonding property, an Au film can be deposited thereon. In this case, in order to prevent production of a fragile Ti-Au intermetallic compound, an Ni film is preferably formed between the two films. A Pd film and the like can be used instead of the Ni film.

In this manner, when a Ti film is used as the conductor, variations in resistance of the heating resistor are small. In addition to this, good adhesion of the Ti film with respect to the substrate (of alumina or the like), the heating resistor and the protection layer is obtained.

For example, when the Ti-Ni-Au conductor is used, Ti, Cr, W, Al or the like can be deposited on the conductor in order to improve adhesion between the conductor and an Al$_2$O$_3$ layer. In order to stabilize the resistance of the thermal head, the above-mentioned thermal annealing is preferably performed after the deposition of the conductor.

What is claimed is:

1. A thermal head having a substrate, and a heating resistor of thin film type formed thereon:
   wherein said heating resistor is a deposited metal oxide film consisting essentially of ruthenium oxide and an oxide of at least one metal M selected from the group consisting of calcium, strontium, barium, lead, bismuth and thallium, and containing as a main component at least one metal oxide selected from the group consisting of RuCaO$_3$, RuSrO$_3$, RuBaO$_3$, RuPbO$_3$, RuTlO$_{7/2}$ and RuBiO$_{7/2}$, said deposited metal oxide film having an atomic ratio M/Ru of the metal M to ruthenium of 0.6 to 2 and a thickness of 1 micron or less.

2. A thermal head according to claim 1, wherein said atomic ratio M/Ru falls within a range between 0.9 to 1.2.

3. A thermal head according to claim 2, wherein said atomic ratio M/Ru is 1.

4. A thermal head according to claim 1, wherein a pair of conductors for supplying electric power is coupled to said heating resistor.

5. A thermal head according to claim 4, wherein said conductors are formed of a metal or a multilayer metal selected from the group consisting of nickel, titanium, nickel-gold, titanium-gold, titanium-nickel-gold, and titanium-lead-gold.

6. A thermal head according to claim 1, wherein a protective layer is formed on a surface of said thermal head.

7. A thermal head according to claim 6, wherein said protective layer consists of aluminum oxide.

8. A thermal head according to claim 1, wherein a glass glazed layer is formed on a surface of said substrate.

* * * * *